United States Patent
Cripe et al.

(10) Patent No.: US 7,859,474 B1
(45) Date of Patent: Dec. 28, 2010

(54) ACTIVE ANTENNA TUNING CIRCUITRY

(75) Inventors: David W. Cripe, Mount Vernon, IA (US); Jeremiah D. Wolf, Cedar Rapids, IA (US); Scott L. Patten, Marion, IA (US); James B. West, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 330 days.

(21) Appl. No.: 12/221,893

(22) Filed: Aug. 7, 2008

(51) Int. Cl.
*H01Q 1/10* (2006.01)

(52) U.S. Cl. .................. 343/745; 343/860; 330/127; 330/297

(58) Field of Classification Search ............. 343/722, 343/745, 850, 860; 330/127, 126, 297
See application file for complete search history.

(56) References Cited

U.S. PATENT DOCUMENTS

| | | | | |
|---|---|---|---|---|
| 3,381,222 A | * | 4/1968 | Gray | 455/77 |
| 3,588,902 A | * | 6/1971 | Willie | 343/745 |
| 4,380,767 A | * | 4/1983 | Goldstein et al. | 343/745 |
| 5,212,491 A | * | 5/1993 | Chin et al. | 343/745 |
| 6,369,651 B1 | * | 4/2002 | Dent | 330/127 |
| 6,621,467 B1 | * | 9/2003 | Marsh | 343/850 |
| 7,202,734 B1 | * | 4/2007 | Raab | 330/126 |
| 7,714,649 B1 | | 5/2010 | Cripe | |

* cited by examiner

*Primary Examiner*—Tho G Phan
(74) *Attorney, Agent, or Firm*—Matthew J. Evans; Daniel M. Barbieri

(57) ABSTRACT

The present invention is a tunable multi-element network for providing impedance transformation. The network may include a first switched capacitor power load modulator circuit and a second switched capacitor power load modulator circuit. The network may further include a series inductive component configured for connecting to at least one of the first power load modulator circuit and the second power load modulator circuit. The network may be further configured for connection to a transmit antenna and a power amplifier. The network may be further configured for receiving an arbitrary impedance from the antenna. The network may be further configured for synthesizing an arbitrary capacitive reactance based on a dynamically controllable phase angle between a switch drive signal provided by the network and an incident Radio Frequency (RF) signal. The network may be further configured for matching the antenna impedance to the power amplifier via the arbitrary capacitive reactance.

20 Claims, 6 Drawing Sheets

ACTIVE ANTENNA TUNING CIRCUITRY

FIELD OF THE INVENTION

The present invention relates to the field of Radio Frequency (RF) devices and particularly to active antenna circuitry for matching an impedance of a transmit antenna to a power amplifier.

BACKGROUND OF THE INVENTION

A number of currently available impedance matching networks may not provide a desired level of performance.

Thus, it would be desirable to provide a solution which addresses the problems associated with currently available solutions.

SUMMARY OF THE INVENTION

Accordingly, an embodiment of the present invention is directed to a load modulator circuit, including: a first switching element and a second switching element, the first switching element including a first output terminal for the circuit, the second switching element including a second output terminal for the circuit; a first capacitor and a second capacitor, the first capacitor configured for being connected to the first switching element, the second capacitor configured for being connected to the second switching element, the first capacitor configured for shunting the first switching element via a first capacitive reactance, the second capacitor configured for shunting the second switching element via a second capacitive reactance; a current source configured for being connected to the switching elements, the current source configured for driving the output terminals; and a driver circuit configured for being connected to the switching elements, the driver circuit configured for driving the switching elements, wherein the load modulator circuit is suitable for connection to an electrically short, transmit antenna and a power amplifier, the load modulator circuit being configured for synthesizing an arbitrary capacitive reactance based upon a dynamically controllable, arbitrary phase angle between a switch drive signal provided by the driver circuit and an incident Radio Frequency (RF) signal provided by the current source, said arbitrary capacitive reactance being utilizable for matching an impedance of the antenna to the power amplifier.

An additional embodiment of the present invention is directed to a load modulator circuit, including: a first switching element and a second switching element, the first switching element including a first output terminal for the circuit, the second switching element including a second output terminal for the circuit; a first capacitor and a second capacitor, the first capacitor configured for being connected to the first switching element, the second capacitor configured for being connected to the second switching element; a first diode and a second diode, the first diode configured for being connected to the first switching element, the second diode configured for being connected to the second switching element, the first diode configured for shunting the first switching element for permitting negative current flow for the circuit prior to conduction by the first switching element, the second diode configured for shunting the second switching element for permitting negative current flow for the circuit prior to conduction by the second switching element; a current source configured for being connected to the switching elements, the current source configured for driving the output terminals; and a driver circuit configured for being connected to the switching elements, the driver circuit configured for driving the switching elements, wherein the load modulator circuit is suitable for connection to an electrically short, transmit antenna and a power amplifier, the load modulator circuit being configured for synthesizing an arbitrary capacitive reactance based upon a dynamically controllable, arbitrary phase angle between a switch drive signal provided by the driver circuit and an incident Radio Frequency (RF) signal provided by the current source, said arbitrary capacitive reactance being utilizable for matching an impedance of the antenna to the power amplifier.

A further embodiment of the present invention is directed to a load modulator circuit, including: a first switching element and a second switching element, the first switching element including a first output terminal for the circuit, the second switching element including a second output terminal for the circuit, the first switching element including a first switch and a second switch, the second switching element including a third switch and a fourth switch; a first capacitor and a second capacitor, the first capacitor configured for being connected to the first switching element, the second capacitor configured for being connected to the second switching element, the first capacitor configured for shunting the first switching element via a first capacitive reactance, the second capacitor configured for shunting the second switching element via a second capacitive reactance; a current source connected to the switching elements, the current source configured for driving the output terminals; and a first driver circuit and a second driver circuit, the first driver circuit configured for being connected to the first switch and the third switch, the second driver circuit configured for being connected to the second switch and the fourth switch, the first driver circuit configured for driving the first switch and the third switch, the second driver circuit configured for driving the second switch and the fourth switch, wherein the load modulator circuit is suitable for connection to an electrically short, transmit antenna and a power amplifier, the load modulator circuit being configured for synthesizing an arbitrary capacitive reactance based upon a dynamically controllable, arbitrary phase angle between a switch drive signal provided by at least one of the first driver circuit and the second driver circuit and an incident Radio Frequency (RF) signal provided by the current source, said arbitrary capacitive reactance being utilizable for matching an impedance of the antenna to the power amplifier.

A still further embodiment of the present invention is directed to a tunable multi-element network for providing impedance transformation, said network including: a first switched-capacitor power load modulator circuit; a second switched-capacitor power load modulator circuit; and a series inductive component configured for connecting to at least one of the first power load modulator circuit and the second power load modulator circuit, wherein the network is configured for connection to a transmit antenna and a power amplifier, the network being further configured for receiving an arbitrary impedance from the antenna, the network being further configured for synthesizing an arbitrary capacitive reactance based on a dynamically controllable phase angle between a switch drive signal provided by the network and an incident Radio Frequency (RF) signal, the network being further configured for matching the antenna impedance to the power amplifier via the arbitrary capacitive reactance. Said multi-element network(s) may be fabricated as an analogue(s) of well-known passive element impedance transforming networks, such as 'Tee', 'Pi' or 'El' networks, with one or more elements containing a switched capacitor power load modulation circuit. The effective value of the switched capacitor element may be varied dynamically for providing a cycle-bycycle impedance match between the antenna and power amplifier over the range of RF signals presented by the power amplifier.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
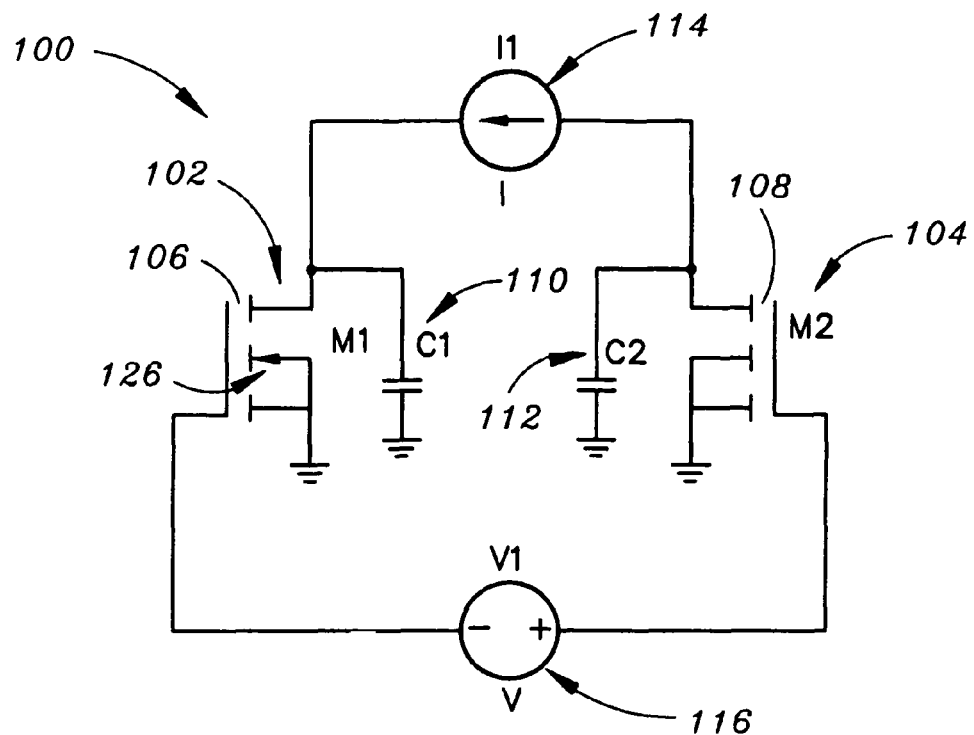
FIG. 1 is a schematic diagram of a load modulator circuit for providing impedance matching in accordance with a first exemplary embodiment of the present invention.

Reference will now be made in detail to the presently preferred embodiments of the invention, examples of which are illustrated in the accompanying drawings.

A transmit antenna (ex. —an electrically short transmit antenna), may, by itself, present a non-ideal antenna impedance to a power amplifier associated with the transmit antenna. Although a passive matching network may be implemented for transforming the antenna impedance (ex. —the non-ideal antenna impedance) to a desired quantity (ex. —an ideal antenna impedance), said network/the resultant network may be generally narrow-banded in its frequency response. Further, an active matching network/active matching circuit (ex. —a Negative Impedance Converter (NIC)), although it may be suitable for application in/implementation with a receive antenna/receive antenna circuit for matching the impedance of the receive antenna to its associated receiver, may lack the dynamic range and efficiency to provide the same functionality in a transmit mode/for a transmit antenna.

As mentioned above, a power amplifier, such as a radio frequency (RF) power amplifier, may be designed to operate with a load which possesses a specific (ex. —ideal) impedance, which may generally be that of the transmission line used for RF power distribution. If the load presented to the power amplifier has an impedance (ex. —non-ideal impedance) which deviates significantly from the ideal impedance, the output power and efficiency of the power amplifier may be degraded.

While it may be possible to design a power amplifier to operate over a significant bandwidth, antennas may often be narrow-band devices. For an electrically small antenna/electrically short antenna, which may be significantly shorter than a resonant half-wavelength, the ratio of the imaginary reactance to the radiation resistance for said antenna may severely limit the bandwidth of said antenna.

A transmit antenna (ex. —electrically short antenna) may be operated through multiple carrier frequencies by switching various reactive elements into an antenna coupling circuit for the antenna in order to match the impedance of the transmit antenna to the power amplifier associated with/communicatively connected to the transmit antenna. At Very Low Frequency (VLF) transmitter frequencies (ex. —radio frequencies (RF) in the range of three kilohertz (3 kHz) to thirty kilohertz (30 kHz)), matching of the antenna impedance to the power amplifier may be been done dynamically by using saturable reactors to match the antenna (ex. —transmit antenna) to the power amplifier in/via a frequency-shift-keying modulation.

As mentioned above, active networks (ex. —Active non-Foster networks) may be used for impedance matching of a receive antenna to its associated receiver. For example, a NIC may be used to synthesize negative capacitive impedances and/or negative inductive impedances, which may improve the bandwidth and signal efficiency of an electrically short receive antenna. The NIC may include an op amp and/or discrete transistor circuitry, all operating in a linear amplifier mode. However, when implemented in a transmit application/ with a transmit antenna, the inefficiencies and power dissipation associated with the NIC (if said NIC had sufficient dynamic range to accommodate the power amplifier signal), may result in the NIC having a size and power consumption which may dwarf those of the power amplifier.

A number of currently available impedance matching networks may not provide a desired level of performance of either frequency bandwidth, electrical efficiency, or both.

A number of circuits may implement transistor switch devices in conjunction with a capacitor to create a load-modulation circuit (as disclosed in U.S. patent application Ser. No. 12/156,479 entitled: "High Efficiency Linear Amplifier Using Non-Linear Circuits", filed Jun. 2, 2008, which is herein incorporated by reference in its entirety), which may be applied in a power supply and power amplifier/power amplifier circuit so as to allow for control of the output of the power circuit/power amplifier circuit by synthesizing an arbitrary capacitive impedance as part of a matching network. This concept may be applicable to a dynamic antenna matching circuit for use with an electrically short transmit antenna.

Exemplary embodiments of the present invention may be directed to/may include a switched capacitor power load modulator for a transmit antenna which may be capable of synthesizing any arbitrary negative imaginary impedance/an arbitrary capacitive reactance, up to the limit of a switch shunt capacitance, via control of a phase of a switch drive signal with respect to an incident RF signal. The capacitive reactance may be used in a transmitter output filter for matching an impedance of a transmit antenna to a power amplifier associated with said transmit antenna. A matching network of the present invention for providing impedance matching functionality for a transmit antenna and a power amplifier associated with said transmit antenna, may include two or more switched capacitor power load modulators/modulator circuits, in conjunction with finite-value fixed reactive elements. Further, said matching network of the present invention may dynamically transform an arbitrary antenna impedance to a value required of the power amplifier, at bandwidths of an octave or higher, and may do so at efficiencies which are orders of magnitude higher than would be capable with a NIC matching circuit. Because the switched capacitor circuit acts in a low-loss switching mode, application of said circuit as a power tuning element may be done in a manner which promotes improved transmitter efficiency.

If operation at more than one frequency is desired, it may be necessary to provide some degree of variability of said components of the coupling network/impedance matching network. Alternatively, an antenna broadbanding network may be provided, such as via a network of passive components derived via filter synthesis techniques, or via an active Non-Foster circuit.

Referring generally to FIG. 1, a load modulator circuit in accordance with an exemplary embodiment of the present invention is shown. The load modulator circuit 100 may include a plurality of switching elements/switches (102, 104—also noted as M1, M2), such as a pair of switching elements. The switching elements (102, 104) may be driven in push-pull (ex. —may be push-pull switching elements). In the illustrated embodiment in FIG. 1, the switching elements (102, 104) may be metal-oxide-semiconductor field-effect transistor (MOSFET) switches. A first switching element 102 included in the plurality of switching elements may include a non-common switch node, which may be a first output terminal 106 for the circuit 100. A second switching element 104 included in the plurality of switching elements may include a non-common switch node, which may be a second output terminal 108 for the circuit 100. In a further embodiment (ex. —in practice) the output terminals (106, 108) may be connected/coupled to an unbalanced load via a balun transformer device.

In further embodiments, the circuit 100 may include a plurality of capacitors (110, 112—also noted as C1, C2). A first capacitor 110 included in the plurality of capacitors may be configured for being connected to the first switching element 102. A second capacitor 112 included in the plurality of capacitors may be configured for being connected to the second switching element 104. Further, each of the switches (102, 104) may be shunted by capacitive reactance. For example, the first capacitor 110 may be configured for shunting the first switching element 102 via a first capacitive reactance (of which an intrinsic capacitance/intrinsic switch capacitance of the first switching element may be a component) and the second capacitor 112 may be configured for shunting the second switching element 104 via a second capacitive reactance (of which an intrinsic capacitance/intrinsic switch capacitance of the second switching element may be a component).

In additional embodiments, the circuit 100 may include a current source 114 (also noted as I1). The current source 114 may be configured for being connected to the switching elements (102, 104). The current source 114 may be further configured for driving the output terminals (106, 108) of the circuit 100. For instance, the current source 114 may drive the output terminals (106, 108) via a Radio Frequency (RF) signal/an incident RF signal/a load current/a current waveform provided by the current source 114.

In exemplary embodiments, the circuit 100 may include a driver circuit/voltage source 116 (also noted as V1). The driver circuit 116 may be configured for being connected to the switching elements (102, 104). The driver circuit 116 may be further configured for driving the switching elements (102, 104). For instance, the driver circuit 116 may drive the switches (102, 104) at a fifty percent (50%) duty. Further, the driver circuit 116 may drive the switches (102, 104) at a frequency of the current source 114. However, the driver circuit 116 may be configured for driving the switches (102, 104) at an arbitrary phase relative to/with respect to that of the current waveform provided by the current source 114. For example, the driver circuit 116 may be configured for driving one or more of the switching elements (102, 104) by providing a switch drive signal/or via a switch drive signal, the switch drive signal being provided at an arbitrary phase angle relative to the incident RF signal/current waveform/load current provided by the current source 114.

In current embodiments of the present invention, the load modulator circuit 100 may be suitable/configured for connection to/being connected to an antenna, such as an electrically short, transmit antenna. Further, the load modulator circuit 100 may be configured for being connected to a power amplifier, such as a power amplifier associated with/connected to the transmit antenna. The load modulator circuit 100 may be further configured for synthesizing an arbitrary capacitive reactance based upon the arbitrary phase angle (ex. —which may be dynamically controllable) between the switch drive signal provided by the driver circuit 116 and the load current/ incident RF signal provided by the current source 114. The synthesized arbitrary capacitive reactance may be utilizable for matching an impedance of the antenna to the power amplifier.

Figure 5A:
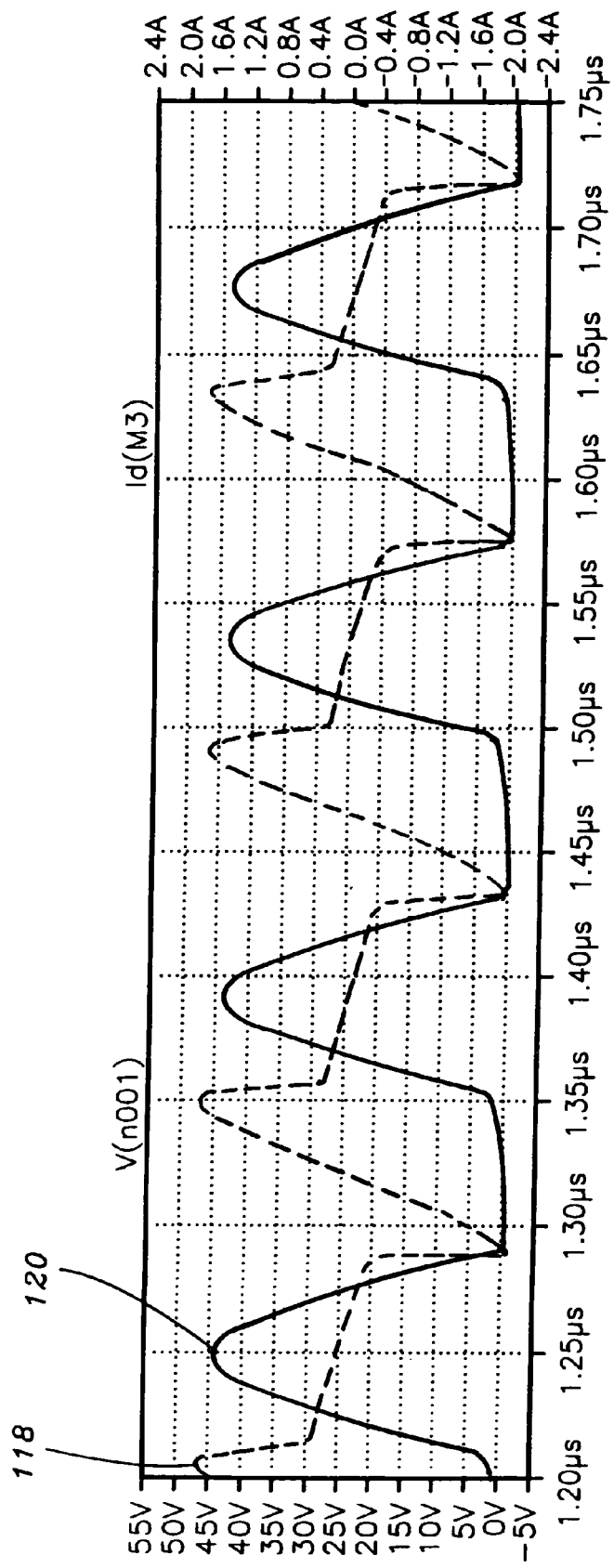
FIG. 5A is a graphical depiction of switch waveforms which may be attained when implementing the circuit of FIG. 1 and when the arbitrary phase angle between the switch drive signal provided by the driver circuit and an incident Radio Frequency (RF) signal provided by the current source is 90 degrees in accordance with an exemplary embodiment of the present invention.

When the arbitrary phase angle/phase angle between the load current/and the switch drive signal is ninety degrees/is established at ninety (90) degrees, switch waveforms, as shown in FIG. 5A, may be attained. For example, a switch current waveform 118 (such as for the first switch 102) and a switch voltage waveform 120 (such as for the second switch 104) may be attained. Further, summing/summation of the voltages/voltage waveforms for switches 102 and 104 may create a sinusoidal waveform which may be equivalent to a waveform which may occur if the entire circuit 100 shown in FIG. 1 were replaced by a capacitor having a value/capacitance/capacitive reactance equal to that of the first capacitor 110.

Figure 5B:
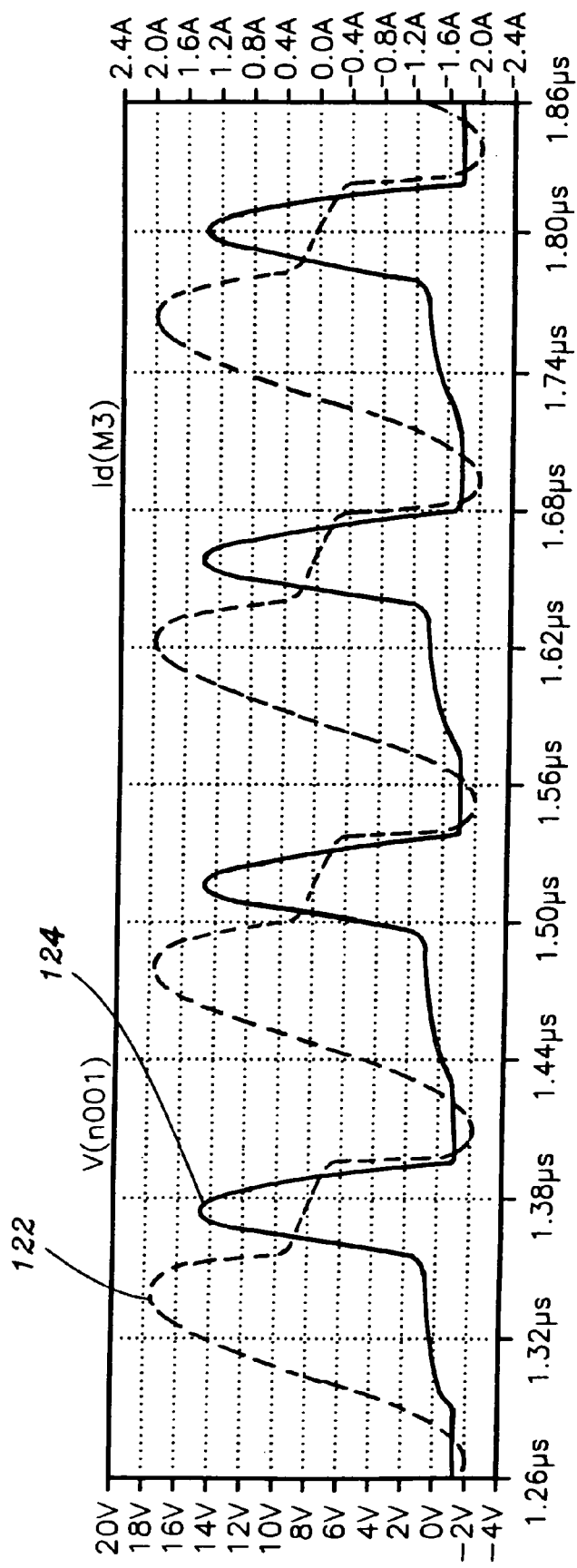
FIG. 5B is a graphical depiction of switch waveforms which may be attained when implementing the circuit of FIG. 1 and when the arbitrary phase angle between the switch drive signal provided by the driver circuit and an incident Radio Frequency (RF) signal provided by the current source is 135 degrees in accordance with an alternative exemplary embodiment of the present invention.

When the arbitrary phase angle/phase angle between the load current/and the switch drive signal is one hundred and thirty-five degrees/is established at one hundred and thirty-five (135) degrees, switch waveforms, as shown in FIG. 5B, may be attained. For example, a switch current waveform 122 (such as for the first switch 102) and a switch voltage waveform 124 (such as for the second switch 104) may be attained. During the first 45 degrees following a return-to-zero of the switch voltage, a negative switch current may be assumed to flow through a body diode 126 of the MOSFET switch (ex. —switch 102). The net effect of shifting the drive by 135 degrees may be that the switch (ex. —switch 102) is effectively conducting for 270 degrees of an RF cycle. The switch waveforms (122, 124) shown in FIG. 5B may be lower in amplitude and shorter in duration than the switch waveforms (118, 120) shown in FIG. 5A.

Figure 5C:
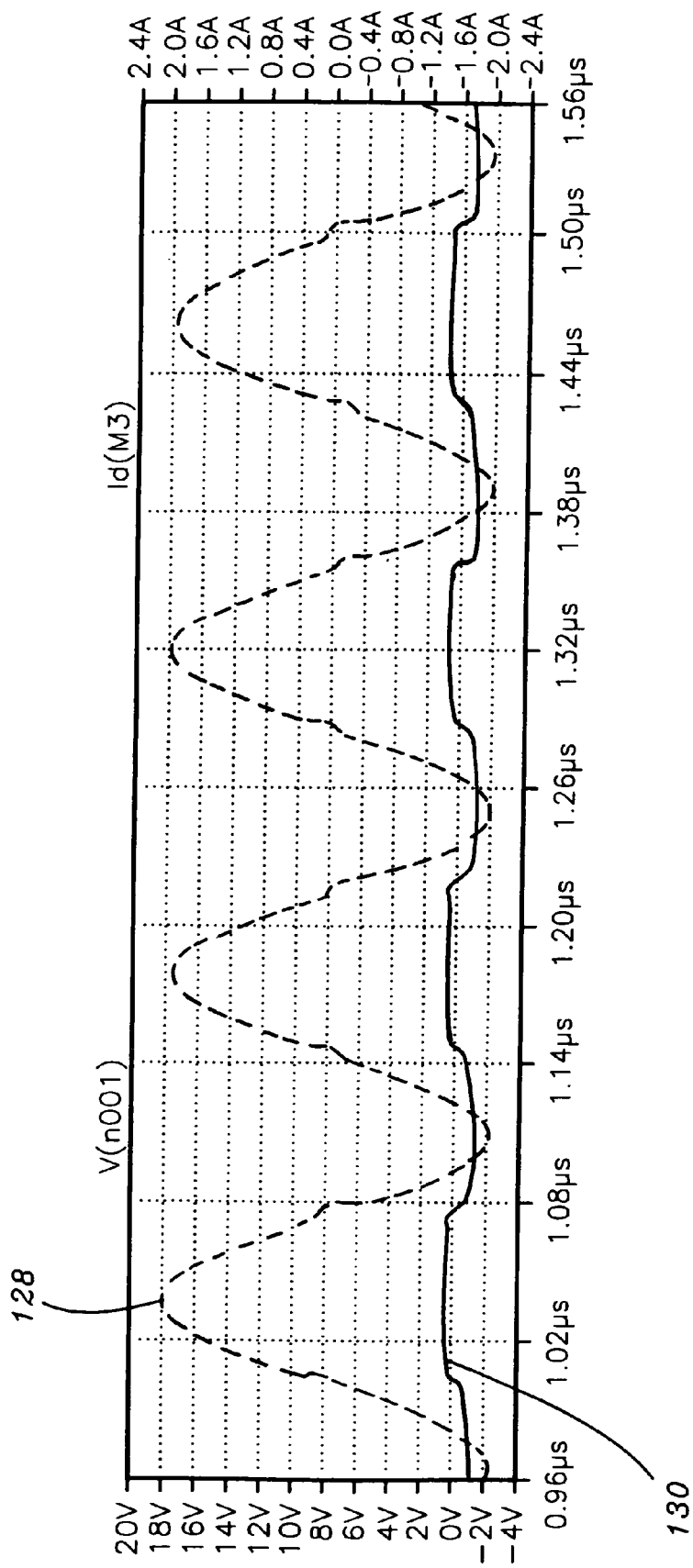
FIG. 5C is a graphical depiction of switch waveforms which may be attained when implementing the circuit of FIG. 1 and when the arbitrary phase angle between the switch drive signal provided by the driver circuit and an incident Radio Frequency (RF) signal provided by the current source is 180 degrees in accordance with an alternative exemplary embodiment of the present invention.

When the arbitrary phase angle/phase angle between the load current/and the switch drive signal is one hundred and eighty degrees/is established at one hundred and eighty (180) degrees, switch waveforms (ex. —a switch current waveform 128 and a switch voltage waveform 130, such as for switch 102 or 104), as shown in FIG. 5C, may be attained. For instance, when the phase angle is at 180 degrees, switch voltage/the switch voltage waveform of at least one of the switches (102, 104) may be substantially zero during an entire RF cycle and the equivalent capacitance of the circuit 100 may be assumed to be infinite. In further embodiments, an effective value of capacitance presented by the circuit 100 may be equal to a capacitance of at least one of the first capacitor 110 and the second capacitor 112 divided by a sine value of the arbitrary phase angle between the switch drive signal and the incident RF signal/load current. Further all switch waveforms (118, 120, 122, 124) generated via driving of the switching elements (102, 104) may be zero-voltage-switching switch waveforms, which may indicate that minimal switching losses may occur in the active switch/switch device (102, 104). Still further, because the switch waveforms (118, 120, 122, 124) may be non-sinusoidal for conditions of drive phase/phase angle other than ninety degrees, it may be implicit that an additional band-pass or low-pass filter structure may be present for preventing radiation of harmonics of a carrier frequency.

Preferably, the drive signal to the switches (102, 104) may be a 50% duty waveform, which may ease requirements of the drive generation circuitry/driver circuit 116, thereby allowing the driver circuit 116 to be free to handle signal phase. In the action of the circuit 100, the switch 100 may effectively conduct over an angle twice that of the phase angle/delay. During a period of negative current flow after switch voltage returns to zero, the body diode 126 of MOSFET switch 102 may be assumed to be in conduction, with clamping switch voltage being clamped to zero prior to actuation of the switch 102. If body diode conduction occurs during the RF cycle of a MOSFET switch (102 or 104), it may be necessary for minimum time to be provided to allow for diode recovery before said switch may be able to support voltage, which may thereby limit applicability of MOSFET switches (102, 104) in the circuit 100 to High Frequency (HF) frequencies (ex. —3 to 30 Megahertz) and below.

Figure 2:
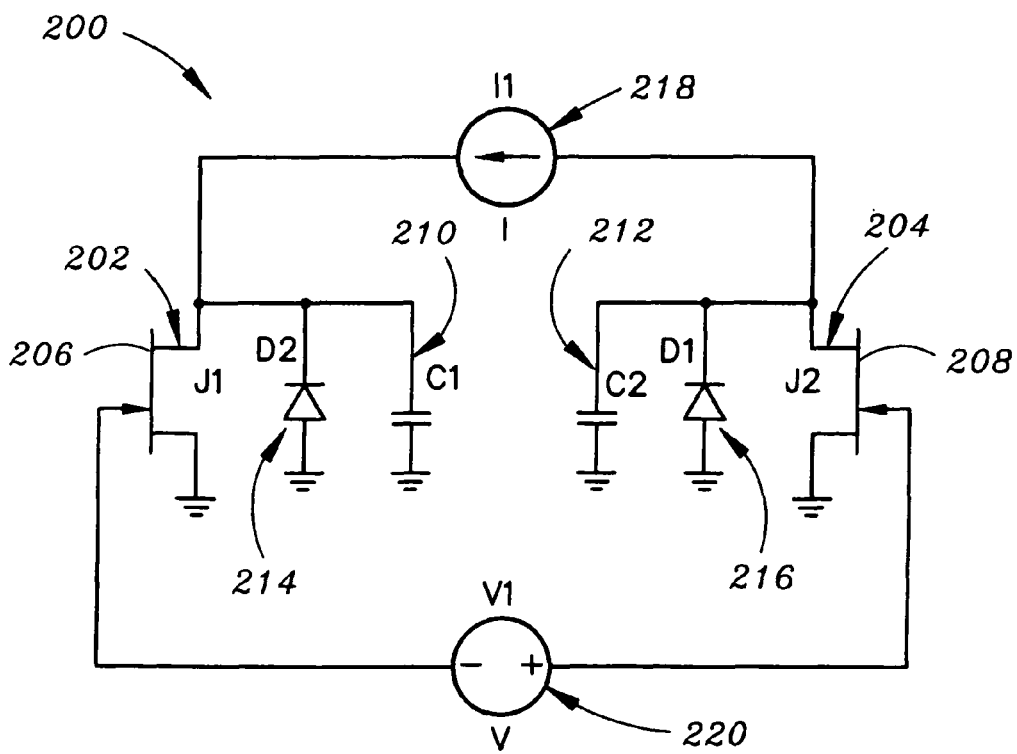
FIG. 2 is a schematic diagram of a load modulator circuit for providing impedance matching, said load modulator circuit implementing Metal Epitaxial Semiconductor Field Effect Transistor (MESFET) switches and shunt diodes in accordance with a further exemplary embodiment of the present invention.

An alternative exemplary embodiment of a load modulator circuit in accordance with the present invention is shown in FIG. 2. The load modulator circuit 200 may include a plurality of switching elements, such as a first switching element 202 and a second switching element 204. Further, the first switching element 202 may include a first output terminal 206 for the circuit 200 and the second switching element 204 may include a second output terminal 208 for the circuit 200. Still further, the first switching element 202 and/or the second switching element 204 may be transistors, such as Metal Epitaxial Semiconductor Field Effect Transistor (MESFET) switches or FET devices. Said MESFET switches may promote use of the circuit 200 shown in FIG. 2 in applications at frequencies which are greater/higher than High Frequency (HF) (ex. —frequencies greater than 30 Megahertz).

In further embodiments, the circuit 200 shown in FIG. 2 may include a plurality of capacitors, such as a first capacitor 210 and a second capacitor 212. The first capacitor 210 may be configured for being connected to the first switching element 202. The second capacitor 212 may be configured for being connected to the second switching element 204. In additional embodiments, the circuit 200 may include a plurality of diodes, such as a first diode 214 and a second diode 216. The first diode 214 may be configured for being connected to the first switching element 202 and the second diode 216 may be configured for being connected to the second switching element 204. Further, the first diode 214 may be configured for shunting the first switching element 202 for permitting negative current flow for the circuit 200 prior to conduction by the first switching element 202. The second diode 216 may be configured for shunting the second switching element 204 for permitting negative current flow for the circuit 200 prior to conduction by the second switching element 204. Because there may be no body diode structure present in devices/switches (ex —MESFETs) which are similar to Junction gate Field Effect Transistors (JFETs), the switching elements (202, 204) of the circuit 200 shown in FIG. 2 may be shunted with the diodes (214, 216), which may promote/permit negative current flow in a pre-switch conduction cycle period. (ex. —a cycle period prior to switch conduction). In further embodiments, the first capacitor 210 may be configured for shunting the first switching element 202 via a first capacitive reactance and the second capacitor 212 may be configured for shunting the second switching element via a second capacitive reactance.

In exemplary embodiments, the circuit 200 may include a current source 218. The current source 218 may be configured for being connected to the switching elements (202, 204). The current source 218 may be further configured for driving the output terminals (206, 208). In further embodiments, the load modulator circuit 200 may include a driver circuit 220. The driver circuit 220 may be configured for being connected to the switching elements (202, 204) and may be further configured for driving the switching elements (202, 204).

In current embodiments of the present invention, the load modulator circuit 200 may function in a manner similar to the circuit 100 described above. However, because of its implementation of MESFET switches (202, 204), the load modulator circuit 200 of the present invention may be implemented for applications having frequencies higher than HF (ex. —frequencies greater than/higher than 30 MHz. Therefore, the driver circuit 220 of the load modulator circuit 200 shown in FIG. 2 may be configured for driving one or both of the switching elements (202, 204) at a frequency of the current source 218, said frequency being greater than 30 Megahertz (MHz). Further, the circuit 200 shown in FIG. 2 may be suitable/configured for connection to/being connected to an antenna, such as an electrically short, transmit antenna. Further, the load modulator circuit 200 may be configured for being connected to a power amplifier, such as a power amplifier associated with/connected to the transmit antenna. The load modulator circuit 200 may be further configured for synthesizing an arbitrary capacitive reactance based upon the arbitrary phase angle (ex. —which may be dynamically controllable) between the switch drive signal provided by the driver circuit 220 and the load current/incident RF signal provided by the current source 218. The synthesized arbitrary capacitive reactance may be utilizable for matching an impedance of the antenna to the power amplifier.

Figure 3:
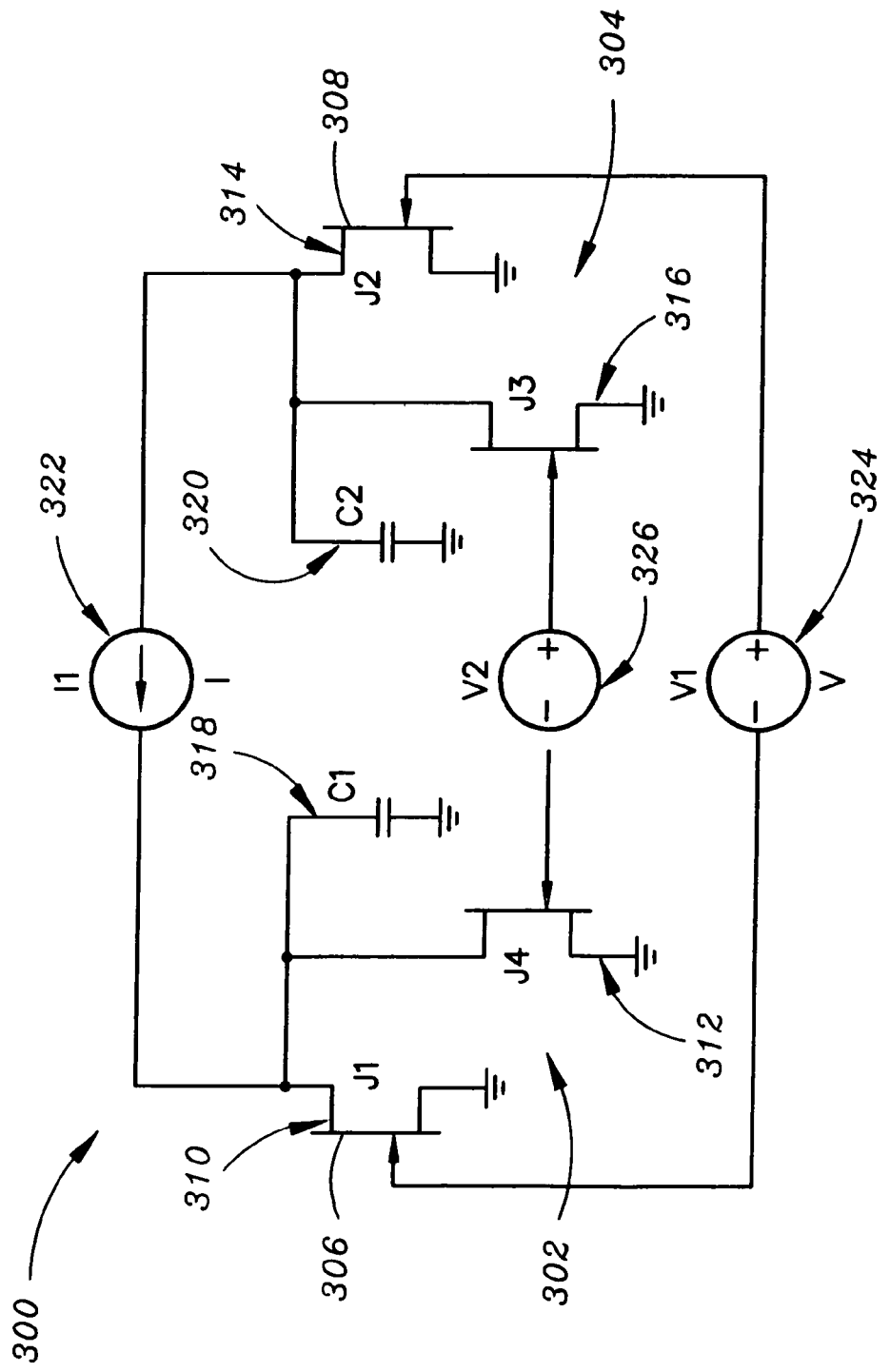
FIG. 3 is a schematic diagram of a load modulator circuit for providing impedance matching, said load modulator circuit implementing switching elements having multiple (ex. —dual) switches in accordance with an alternative exemplary embodiment of the present invention.

A further alternative exemplary embodiment of a load modulator circuit in accordance with the present invention is shown in FIG. 3. The load modulator circuit 300 may include a plurality of switching elements, such as a first switching element 302 and a second switching element 304. The first switching element 302 may include a first output terminal 306 for the circuit 300 and the second switching element 304 may include a second output terminal 308 for the circuit 300. The first switching element 302 may further include a first switch 310 and a second switch 312. The second switching element 304 may further include a third switch 314 and a fourth switch 316.

In further embodiments, the circuit 300 may include a first capacitor 318 and a second capacitor 320. The first capacitor 318 may be configured for being connected to the first switching element 302 and the second capacitor 320 may be configured for being connected to the second switching element 304. The first capacitor 318 may be configured for shunting the first switching element 302 via a first capacitive reactance and the second capacitor 320 may be configured for shunting the second switching element 304 via a second capacitive reactance.

In additional embodiments, the circuit 300 may include a current source 322. The current source 322 may be connected to the switching elements (302, 304), the current source 322 may be configured for driving the output terminals (306, 308). The circuit 300 may further include a first driver circuit 324 and a second driver circuit 326. The first driver circuit 324 may be configured for being connected to the first switch 310 and/or the third switch 314. The second driver circuit 326 may be configured for being connected to the second switch 312 and/or the fourth switch 316. The first driver circuit 324 may be configured for driving the first switch 310 and/or the third switch 314. The second driver circuit 326 may be configured for driving the second switch 312 and/or the fourth switch 316. For instance, the first driver circuit 324 may be configured for driving at least one of the first switch 310 and the third switch 314 via a fifty percent (50%) duty signal and the second driver circuit 326 may be configured for driving at least one of the second switch 312 and the fourth switch 316 via a fifty percent (50%) duty signal.

In current embodiments of the present invention, the load modulator circuit 300 may function in a manner similar to the circuits 100, 200 described above. However, by Implementing multiple switches (310, 312, 314, 316) in the switching elements (302, 304) as described above, and driving said switches (310, 312, 314, 316) as described above, the circuit 300 shown in FIG. 3 may promote increased/higher efficiency than the above-described circuits (100, 200). Further, the switching elements (302, 304) of the circuit 300 shown in FIG. 3 may be phase-shifted complimentarily for creating an effective switch duty angle variable from one hundred-eighty (180) degrees to three hundred-sixty (360) degrees. Still further, the circuit 300 shown in FIG. 3 may be suitable/configured for connection to/being connected to an antenna, such as an electrically short, transmit antenna. Further, the load modulator circuit 300 may be configured for being connected to a power amplifier, such as a power amplifier associated with/connected to the transmit antenna. The load modulator circuit 300 may be further configured for synthesizing an arbitrary capacitive reactance based upon the arbitrary phase angle (ex. —which may be dynamically controllable) between the switch drive signal provided by at least one of the driver circuits (324, 326) and the load current/incident RF signal provided by the current source 322. The synthesized arbitrary capacitive reactance may be utilizable for matching an impedance of the antenna to the power amplifier.

Figure 4:
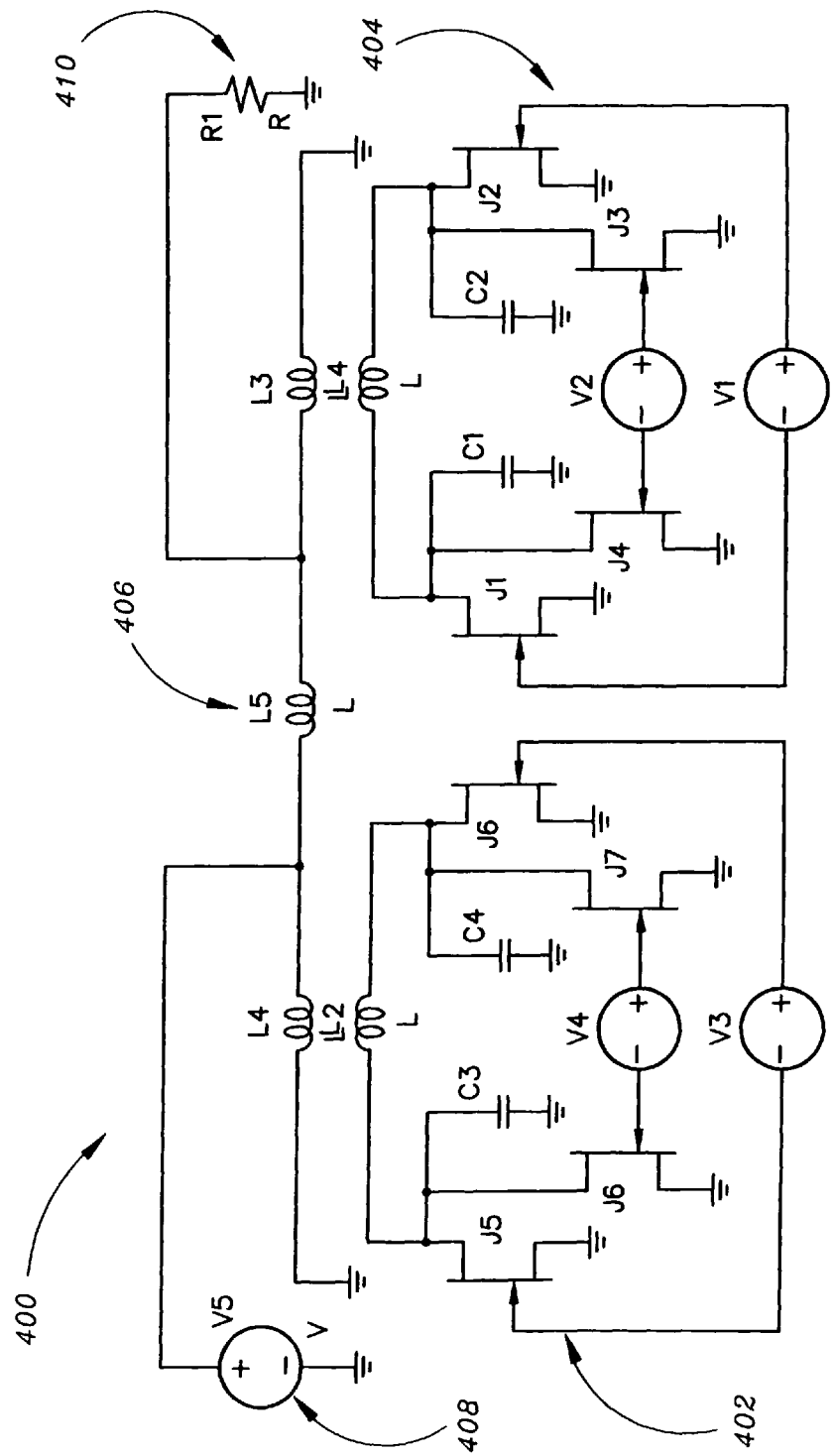
FIG. 4 is a tunable PI network for providing impedance transformation in accordance with a further exemplary embodiment of the present invention.

In a further embodiment, a tunable multi-element network (ex. —a PI network) for providing impedance transformation in accordance with the present invention is shown in FIG. 4. The network 400 may include a first switched capacitor power load modulator circuit 402 and a second switched capacitor power load modulator circuit 404. The network 400 may further include a series inductive component 406 (also noted as L5). The series inductive component 406 may be configured for connecting to the first power load modulator circuit 402 and/or the second power load modulator circuit 404. The network 400 is configured for connection to an antenna, such as an electrically-short, transmit antenna and a power amplifier 408 (also noted as V5). The network 400 may be further configured for receiving an arbitrary impedance 410 (also noted as R1) from the antenna. The network 400 may be further configured for synthesizing one or more arbitrary capacitive reactances based on a dynamically controllable phase angle/dynamically controlling the phase angle between one or more switch drive signals provided by the network 400 (via one or more driver circuits 412, 414, 416, 418 of the network 400, also noted as V1, V2, V3, V4) and one or more incident RF signals. The network 400 may be further configured for matching the antenna impedance 410/a wide range of antenna impedances to the power amplifier 408 via the arbitrary capacitive reactance(s). In further embodiments, the synthesized arbitrary capacitance(s) may be limited by a switch shunt capacitance value(s) of the network 400.

The present invention as described above may promote improved bandwidth and efficiency of broadband radio systems operating into compromise antennas. Further, the present invention may be implemented with/may allow the use of electrically small or narrow-band antennas, which may promote size reduction of portable or hand-held radio systems.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A load modulator circuit, comprising:
   a first switching element and a second switching element, the first switching element including a first output terminal for the circuit, the second switching element including a second output terminal for the circuit;
   a first capacitor and a second capacitor, the first capacitor configured for being connected to the first switching element, the second capacitor configured for being connected to the second switching element, the first capacitor configured for shunting the first switching element via a first capacitive reactance, the second capacitor configured for shunting the second switching element via a second capacitive reactance;

a current source configured for being connected to the switching elements, the current source configured for driving the output terminals; and a driver circuit configured for being connected to the switching elements, the driver circuit configured for driving the switching elements, wherein the load modulator circuit is suitable for connection to an electrically short, transmit antenna and a power amplifier, the load modulator circuit being configured for synthesizing an arbitrary capacitive reactance based upon a dynamically controllable, arbitrary phase angle between a switch drive signal provided by the driver circuit and an incident Radio Frequency (RF) signal provided by the current source, said arbitrary capacitive reactance being utilizable for matching an impedance of the antenna to the power amplifier.

2. A load modulator circuit as claimed in claim 1, wherein the switching elements are push-pull switching elements.

3. A load modulator circuit as claimed in claim 2, wherein the switching elements are metal-oxide-semiconductor field-effect transistor (MOSFET) switches.

4. A load modulator circuit as claimed in claim 1, wherein the driver circuit is configured for driving the switching elements at fifty percent (50%) duty.

5. A load modulator circuit as claimed in claim 1, wherein the driver circuit is configured for driving at least one of the first switching element and the second switching element at a frequency of the current source.

6. A load modulator circuit as claimed in claim 1, wherein the driver circuit is configured for driving at least one of the first switching element and the second switching element by providing the switch drive signal at the arbitrary phase angle relative to the incident Radio Frequency (RF) signal provided by the current source.

7. A load modulator circuit as claimed in claim 6, wherein an effective value of capacitance presented by the circuit is equal to a capacitance of at least one of the first capacitor and the second capacitor divided by a sine value of the arbitrary phase angle between the switch drive signal and the incident RF signal.

8. A load modulator circuit as claimed in claim 1, wherein driving of the switching elements generates zero-voltage-switching switch waveforms.

9. A load modulator circuit as claimed in claim 1, wherein the first capacitive reactance includes an intrinsic capacitance of the first switching element and the second capacitive reactance includes an intrinsic capacitance of the second switching element.

10. A load modulator circuit, comprising:

a first switching element and a second switching element, the first switching element including a first output terminal for the circuit, the second switching element including a second output terminal for the circuit;

a first capacitor and a second capacitor, the first capacitor configured for being connected to the first switching element, the second capacitor configured for being connected to the second switching element;

a first diode and a second diode, the first diode configured for being connected to the first switching element, the second diode configured for being connected to the second switching element, the first diode configured for shunting the first switching element for permitting negative current flow for the circuit prior to conduction by the first switching element, the second diode configured for shunting the second switching element for permitting negative current flow for the circuit prior to conduction by the second switching element;

a current source configured for being connected to the switching elements, the current source configured for driving the output terminals; and a driver circuit configured for being connected to the switching elements, the driver circuit configured for driving the switching elements, wherein the load modulator circuit is suitable for connection to an electrically short, transmit antenna and a power amplifier, the load modulator circuit being configured for synthesizing an arbitrary capacitive reactance based upon a dynamically controllable, arbitrary phase angle between a switch drive signal provided by the driver circuit and an incident Radio Frequency (RF) signal provided by the current source, said arbitrary capacitive reactance being utilizable for matching an impedance of the antenna to the power amplifier.

11. A load modulator circuit as claimed in claim 10, wherein the driver circuit is configured for driving the switching elements at a frequency of the current source, the frequency being greater than thirty Megahertz.

12. A load modulator circuit as claimed in claim 10, wherein the first capacitor is configured for shunting the first switching element via a first capacitive reactance and the second capacitor is configured for shunting the second switching element via a second capacitive reactance.

13. A load modulator circuit as claimed in claim 10, wherein the switching elements are Metal Epitaxial Semiconductor Field Effect Transistor (MESFET) switches.

14. A load modulator circuit, comprising:

a first switching element and a second switching element, the first switching element including a first output terminal for the circuit, the second switching element including a second output terminal for the circuit, the first switching element including a first switch and a second switch, the second switching element including a third switch and a fourth switch;

a first capacitor and a second capacitor, the first capacitor configured for being connected to the first switching element, the second capacitor configured for being connected to the second switching element, the first capacitor configured for shunting the first switching element via a first capacitive reactance, the second capacitor configured for shunting the second switching element via a second capacitive reactance;

a current source connected to the switching elements, the current source configured for driving the output terminals; and a first driver circuit and a second driver circuit, the first driver circuit configured for being connected to the first switch and the third switch, the second driver circuit configured for being connected to the second switch and the fourth switch, the first driver circuit configured for driving the first switch and the third switch, the second driver circuit configured for driving the second switch and the fourth switch, wherein the load modulator circuit is suitable for connection to an electrically short, transmit antenna and a power amplifier, the load modulator circuit being configured for synthesizing an arbitrary capacitive reactance based upon a dynamically controllable, arbitrary phase angle between a switch drive signal provided by at least one of the first driver circuit and the second driver circuit and an incident Radio Frequency (RF) signal provided by the current source, said arbitrary capacitive reactance being utilizable for matching an impedance of the antenna to the power amplifier.

15. A load modulator circuit as claimed in claim 14, wherein first driver circuit is configured for driving the first switch and the third switch via a fifty percent (50%) duty signal.

16. A load modulator circuit as claimed in claim 14, wherein the first switching element and the second switching element are configured for being phase-shifted for variably providing an effective switch duty angle, the effective switch duty angle being a value ranging from one hundred eighty (180) to three hundred sixty (360) degrees.

17. A tunable multi-element network for providing impedance transformation, said network comprising:
   a plurality of switched capacitor power load modulator circuits; and
   a series inductive component configured for connecting to at least one switched capacitor power load modulator circuit included in the plurality of switched capacitor power load modulator circuits, wherein the network is configured for connection to a transmit antenna and a power amplifier, the network being further configured for receiving an arbitrary impedance from the antenna, the network being further configured for synthesizing an arbitrary capacitive reactance based on a dynamically controllable phase angle between a switch drive signal provided by the network and an incident Radio Frequency (RF) signal, the network being further configured for matching the antenna impedance to the power amplifier via the arbitrary capacitive reactance.

18. A network as claimed in claim 17, wherein the synthesized arbitrary capacitive reactance is limited by a switch shunt capacitance value of the network.

19. A network as claimed in claim 17, wherein the switch drive signal is provided via a driver circuit of the network.

20. A network as claimed in claim 17, wherein the antenna is an electrically short antenna.

* * * * *